United States Patent [19]
Hekimian

[11] 3,731,232

[45] May 1, 1973

[54] PHANTASTRON CIRCUIT EMPLOYING OPERATIONAL AMPLIFIER

[75] Inventor: Norris C. Hekimian, Rockville, Md.

[73] Assignee: Hekimian Laboratories, Inc., Rockville, Md.

[22] Filed: July 13, 1971

[21] Appl. No.: 162,088

[52] U.S. Cl. ..................332/31 R, 307/228, 307/249, 328/127, 328/183, 330/103, 332/37 D

[51] Int. Cl. ..................H03c 1/06

[58] Field of Search..................332/31, 31 T, 31 R, 332/37 D, 38; 330/103, 104, 249; 307/228; 328/127, 128, 183

[56] References Cited

UNITED STATES PATENTS

| | | | |
|---|---|---|---|
| 3,562,673 | 2/1971 | Caspari | 332/31 T |
| 3,072,856 | 1/1963 | Close | 327/185 |
| 3,581,224 | 5/1971 | Nercessian | 330/103 UX |
| 3,237,002 | 2/1966 | Patmore | 330/103 UX |
| 3,579,150 | 5/1971 | Badessa | 330/104 |

OTHER PUBLICATIONS

Miche, "Ramp Generator" October 1970, pp. 1255–1256 Vol. 13, No. 5 IBM Technical Disclosure Bulletin

*Primary Examiner*—Alfred L. Brody
*Attorney*—Rose & Edell

[57] ABSTRACT

A phantastron circuit includes an operational amplifier connected as an absolute value amplifier by connecting its inverting and non-inverting input terminals through respective oppositely poled diodes to a common input junction. The input junction is resistively coupled to a source of supply voltage and capacitively coupled to the output terminal of the operation amplifier. The capacitor thus provides positive feedback to the non-inverting input terminal when the amplifier output signal exhibits positive rate of change, and supplies negative feedback to the inverting input terminal when the output signal exhibits negative rate of change. In the quiescent state the diode at the inverting input terminal is back biased and the non-inverting input terminal is clamped slightly above ground to provide a high positive output signal from the amplifier. Application of a positive trigger to the inverting input terminal or a negative trigger to the non-inverting terminal produces a negative going step at the output terminal of the amplifier which, through the feedback capacitor, back biases the diode at the non-inverting terminal and forward biases the diode at the inverting input terminal to thereby create a negative feedback loop. The capacitor runs down linearly by means of a constant current delivered to the power supply resistively coupled to the common input junction. When the amplifier output reaches a predetermined negative limit, the polarity of the rate of change reverts to positive, thereby reversing the bias on the input diodes and creating a positive feedback loop. Recovery time is substantially instantaneous by virtue of the feedback action and relatively low resistance in the charging circuit for the capacitor.

9 Claims, 2 Drawing Figures

INVENTOR
NORRIS C. HEKIMIAN

By Rose & Edell
ATTORNEYS

PHANTASTRON CIRCUIT EMPLOYING OPERATIONAL AMPLIFIER

BACKGROUND OF THE INVENTION

The present invention relates to phantastron circuits, and more particularly to phantastron circuits employing operational amplifiers to achieve a high degree of linearity and a minimal recovery time.

Phantastron circuits are well known in the prior art. Essentially these circuits may be characterized as Miller sweep circuits in which a trigger of short duration initiates a Miller type sweep and then the circuit itself supplies its gate for the remainder of the sweep interval. The ideal phantastron circuit provides an output signal which resides at some quiescent level until triggered and then, after a small negative going step, decreases linearly with respect to time until some preestablished minimum level is attained, at which time the signal returns to its quiescent level. As a practical matter, a high degree of linearity is not easily achieved. Moreover, the recovery interval, during which the phantastron signal returns to its quiescent level, is often unduly long, and any triggers received during this recovery interval produce a distorted sweep signal.

It is therefore an object of the present invention to provide a phantastron circuit having an output signal exhibiting a high degree of sweep linearity followed by a relatively insignificant recovery time.

It is another object of the present invention to provide a new and improved phantastron sweep circuit employing an operational amplifier.

It is still another object of the present invention to provide a phantastron circuit in which the sweep interval may be selectively modified without sacrificing sweep linearity and recovery time improvement.

It is still another object of the present invention to provide a phantastron circuit employing an operational amplifier wherein the phantastron sweep time interval may be selectively modulated.

SUMMARY OF THE INVENTION

The phantastron circuit of the present invention utilizes an absolute value amplifier comprising an operational amplifier having its non-inverting input terminal connected to a common input terminal via a positively poled diode and having its inverting input terminal connected to the common input terminal via a negatively poled diode. The common input terminal is connected to a source of positive voltage via a bias resistor and to the output terminal of the operational amplifier via an integrating capacitor. Positive excursions at the non-inverting input terminal of the operational amplifier are limited by a diode connected between that terminal and ground. Positive triggers for the circuit are applied to the inverting input terminal; negative triggers are applied to the non-inverting input terminal. In the quiescent state the positively poled input diode is forward biased and the negatively poled input diode is reverse biased, thereby providing a relatively high quiescent output voltage from the operational amplifier and a high charge across the integrating capacitor. When the amplifier is triggered its output signal exhibits a small negative going step which is reflected back through the integrating capacitor to the common input terminal to back bias the positively poled diode and forward bias the negatively poled diode. With the negatively poled diode forward biased a negative feedback loop exists from the output terminal of the amplifier through the integrating capacitor and negatively poled diode to the inverting input terminal of the operational amplifier. This feedback maintains the input voltage at the differential amplifier at a very low and relatively constant level, thereby permitting the integrating capacitor to discharge linearly through the source resistively coupled to the common input terminal. The discharge continues until the negative limit of the operational amplifier is reached at which point a sudden positive going signal at the output terminal is reflected back to reverse conduction of the input diodes and thereby create a positive feedback loop to the non-inverting input terminal of the amplifier. At this point the integrating capacitor charges with a relatively short recovery time through the positively poled diode and limiting diode connected to the non-inverting input terminal of the amplifier.

Sweep duration modulation is readily achieved by employing a modulation signal through a diode to the output terminal of the amplifier. Operation proceeds as described above except that when the sweep falls to the level at which the modulation signal coupling diode is forward biased the ramp is terminated and positive feedback is re-established to provide the short recovery interval.

BRIEF DESCRIPTION OF THE DRAWINGS

The above and still further objects, features and advantages of the present invention will become apparent upon consideration of the following detailed description of specific embodiments thereof, especially when taken in conjunction with the accompanying drawings, wherein.

DESCRIPTION OF THE PREFERRED EMBODIMENTS

Figure 1:
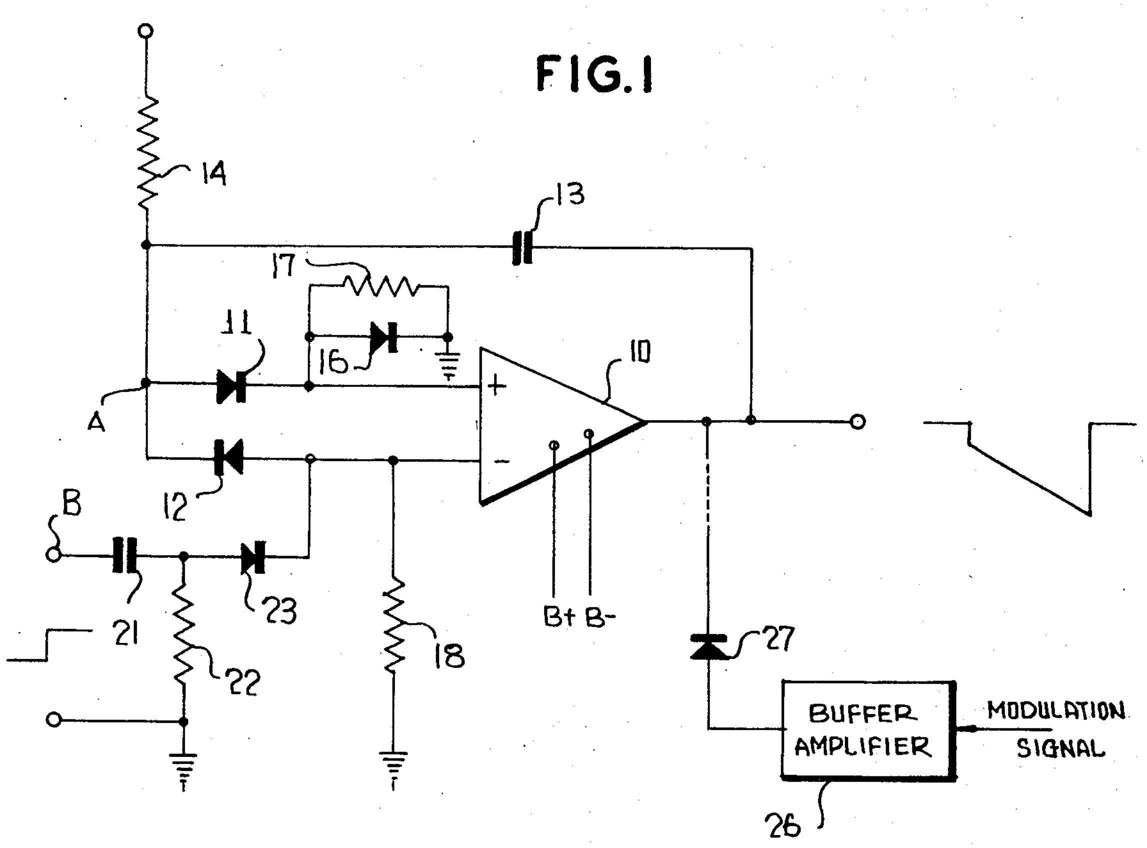
FIG. 1 is a schematic diagram of the phantastron circuit of the present invention.
Figure 2:
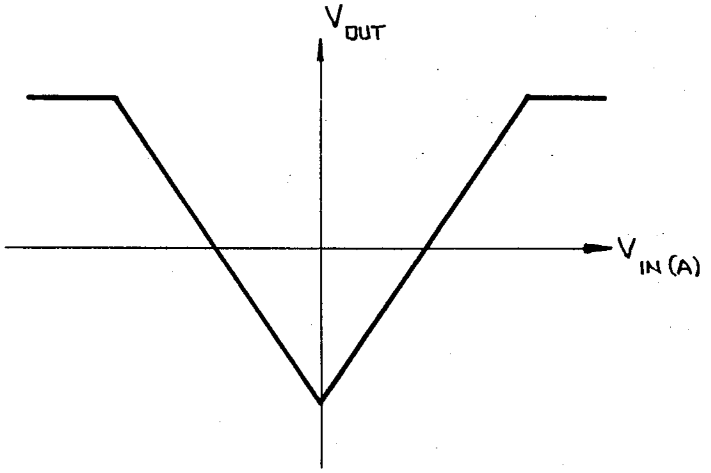
FIG. 2 is a plot of the output voltage versus input voltage characteristic of the absolute value amplifier employed in the circuit of FIG. 1.

Referring specifically to FIG. 1 of the accompanying drawings, the phantastron circuit of the present invention comprises an operational amplifier 10 which, for example, may be one half of the model MC1458, manufactured by Motorola Corporation. A diode 11 has its cathode connected to the non-inverting input terminal (+) of amplifier 10 and its anode connected to a common input junction A. A second diode 12 has its cathode connected to a common input junction A and its anode connected to the inverting input terminal (−) of amplifier 10. The combination of amplifier 10 and diodes 11 and 12 comprises an absolute value amplifier having an output voltage ($V_{out}$) versus input voltage ($V_{in}$) characteristic of the type illustrated in FIG. 2. More particularly, the output signal of the absolute value amplifier becomes increasingly positive as the input signal at common input terminal A increases in absolute value. Stated in another way, assuming the voltage at the terminal A to be initially zero, if this voltage increases either negatively or positively the output terminal of the amplifier experiences a positive going change.

A feedback capacitor 13 is connected between junction A and the output terminal of amplifier 10. In addition junction A is resistively coupled to a DC supply (B+) by resistor 14.

The non-inverting input terminal of amplifier 10 is coupled to the anode of diode 16, the latter having its cathode connected directly to ground. A resistor 17 is connected in parallel across diode 16. The inverting input terminal of amplifier 10 is connected to ground via resistor 18.

A trigger circuit includes an input terminal B connected directly to an AC coupling capacitor 21 which in turn is resistively coupled to ground by means of resistor 22. The junction between capacitor 21 and resistor 22 is connected to the anode of diode 23, the latter having its cathode tied to the inverting input terminal of amplifier 10. Capacitor 21 and resistor 22 serve as a differentiating circuit which passes transitions in signals applied between terminal B and ground to the anode of diode 23. Diode 23 is polarized so as only to pass positive going transitions.

The circuit as thus far described operates in the following manner. In the quiescent state (i.e. — absent an input trigger signal), input junction A is maintained at a small positive voltage above ground by the forward voltage drops across diodes 11 and 16. Diode 12 on the other hand is back biased. Under these conditions there is a small positive voltage (i.e. — the drop across diode 16) applied to the non-inverting input terminal of amplifier 10 while the inverting input terminal is substantially grounded through resistor 18. The positive voltage existing between the non-inverting and inverting input terminals causes a positive output voltage, slightly below B+, at the output terminal of amplifier 10. Capacitor 13 is charged by the positive voltage difference existing between the output terminal of the amplifier and input junction A, and remains so charged until a trigger is applied to terminal B.

When a positive going transition occurs at terminal B a voltage spike is passed by diode 23 to the inverting terminal of amplifier 10. The amplifier acts by providing a sudden negative going step at its output terminal. Since the voltage across capacitor 13 cannot change instantaneously, this negative going step is reflected through capacitor 13 to input junction A where it back biases diodes 11 and 16 and forward biases diode 12. The circuit is stable in this state wherein a negative feedback loop subsists between the output terminal and inverting input terminal of amplifier 10 via capacitor 13 and diode 12. In this state the circuit operates as a well known Miller sweep circuit such as is described on pages 212 through 228 of "Pulse and Digital Circuits" by Millman and Taub, McGraw Hill Book Co., Inc., 1956. More particularly, the negative feedback action between the amplifier output and input terminal A acts to maintain a very low and constant voltage at point A while supply current flows through resistor 14 and capacitor 13 to discharge the capacitor. This discharging current is constant because of the constant voltage at point A and therefore produces a linear discharge or run down of capacitor 13. As the capacitor runs down linearly, the output voltage of amplifier 10 decreases linearly also to provide a linear output sweep voltage. The sweep continues as capacitor 13 first discharges and then begins charging in an opposite sense until a negative limit output voltage is reached for the amplifier. More particularly, the negative limit of the amplifier output signal is determined by the negative bias supply for the amplifier. When this limit is reached the rate of change of the output signal reverses suddenly from negative to positive. This sudden reversal is reflected through capacitor 13 to common input junction A to back bias diode 12 and forward bias diodes 11 and 16. This creates a positive or regenerative feedback path between the output terminal and non-inverting input terminal of amplifier 10 via capacitor 13 and diode 11. This regenerative feedback path reinforces the positive change at the amplifier output terminal, permitting capacitor 13 to charge quickly through the relatively low resistances of diodes 11 and 16. The result is an apparent sudden step in the output wave shape from the negative limit of the amplifier to the quiescent positive level of the amplifier.

The key to circuit operation is the fact that feedback via capacitor 13 is regenerative for positive output signal rate of change and degenerative for negative output signal rate of change. The degenerative or negative feedback mode permits a constant voltage to be maintained at junction A so that a sweep with a high degree of linearity may be obtained. The regenerative feedback mode permits the wave shape to have an insignificantly small recovery time.

Resistor 14, in addition to providing a measure for the constant current during the sweep interval, serves to maintain the output voltage of amplifier 10 at a high positive level during the quiescent mode. Diode 16 prevents the non-inverting input terminal from becomming more positive than approximately 0.6 volts (the drop across diode 16) so that a relatively small positive trigger applied to diode 23 is able to switch the circuit to its negative feedback mode. It is to be understood of course that negative triggers can be coupled to the non-inverting input terminal if desired. Resistors 17 and 18 are necessary to provide defined voltage levels when diodes 11 and 12, respectively, are reverse biased.

The circuit of FIG. 1 has been constructed and operated successfully with the component and parameter values listed below in Table I:

TABLE I

| | |
|---|---|
| Resistor 14 | 8.2K |
| Resistor 17 | 20K |
| Resistor 18 | 10K |
| Resistor 22 | 20K |
| Capacitor 13 | 0.22uf |
| Capacitor 21 | 0.001uf |
| B+ | +12vdc |
| B− | −12vdc |
| Input Trigger | 4 volt step |
| Output sweep duration | 1.5ms |

The sweep duration can be modulated by applying a modulation signal to the output terminal of amplifier 10. More specifically, a modulation signal is applied to a buffer amplifier 26 which in turn feeds the anode of a diode 27. The cathode of the diode is connected to the output terminal of amplifier 10. Buffer amplifier 26 may, for example, be the other half of the MC1458 operational amplifier utilized for amplifier 10. A sweep duration modulation is achieved by applying a DC modulation signal through the buffer amplifier and the diode to the output terminal. The sweep voltage is initiated in the manner described above and continues until such time as the amplifier output voltage falls below the modulation signal voltage applied to the anode of diode 27 to thereby render diode 27 conductive. At this point, when diode 27 is forward biased, the run down of capacitor 13 is stopped and a positive step is reflected back to terminal A to re-establish the positive or regenerative feedback loop and restore the circuit to its quiescent condition. This sweep duration modulation technique provides a high input impedance approach to generating pulse widths proportional to the modulation. Importantly, modulation signal input current flows only for a brief instant during the time it takes to switch the phantastron circuit from its negative feedback mode to its positive feedback mode.

The values listed in Table I are intended to be representative only and can be varied as desired to attain different voltages, sweep intervals, etc. In fact the operational amplifier utilized may be other than that specified by way of example herein. In this regard, however, it is important that the operational amplifier have a very high gain, a high common mode rejection, an output voltage swing which is limited essentially only by the supply voltages, and a very low output impedance.

While I have described and illustrated specific embodiments of my invention, it will be clear that variations of the details of construction which are specifically illustrated and described may be resorted to without departing from the true spirit and scope of the invention as defined in the appended claims.

What is claimed is:

1. A phantastron circuit comprising:
- an operational amplifier having a non-inverting input terminal, an inverting input terminal, and an output terminal;
- a negative feedback path, including a storage capacitor, connected between said output terminal and said inverting input terminal;
- a positive feedback path, including said storage capacitor, connected between said output terminal and said non-inverting input terminal;
- means for maintaining a predetermined charge in a first sense across said storage capacitor in a quiescent mode of said circuit;
- means for applying a trigger pulse to one of said input terminals;
- means responsive to application of said trigger pulse to said one input terminal for rendering said positive feedback path inoperative and rendering said negative feedback path operative to discharge said storage capacitor linearly with respect to time; and
- means responsive to discharge of said capacitor to a predetermined level for rendering said negative feedback path inoperative and rendering said positive feedback path operative to establish said predetermined charge across said storage capacitor.

2. A phantastron circuit comprising:
- a high gain absolute value amplifier circuit having an input terminal and an output terminal and means for providing an output signal at said output terminal which varies according to- the absolute value of the signal applied to said input terminal;
- an integrator capacitor connected between said output and input terminals;
- a source of supply voltage;
- a current limiting resistor connected between said source and said input terminal;
- means for selectively triggering said amplifier;
- means responsive to triggering of said amplifier for initiating constant current flow through said capacitor.

3. A phantastron circuit comprising:
- an operational amplifier having a non-inverting input terminal, an inverting input terminal, and an output terminal;
- a common junction;
- a first diode having its anode connected to said common junction and its cathode connected to said non-inverting input terminal;
- a second diode having its anode connected to said inverting input terminal and its cathode connected to said common junction;
- an integrating capacitor connected between said output terminal and said common junction;
- a source of positive voltage;
- a first resistor connected between said source and said common junction; and
- trigger means for applying a trigger to one of said terminals for causing the voltage at said output terminal to drop sufficiently to back bias said first diode and forward bias said second diode.

4. The phantastron circuit of claim 3 wherein said one of said input terminals is said inverting input terminal, and wherein said trigger is a positive voltage pulse.

5. The phantastron circuit according to claim 4 wherein said trigger means includes a differentiating circuit and a diode for passing a positive pulse to said inverting input terminal in response to each positive going transition of signals applied to said differentiating circuit.

6. The phantastron circuit according to claim 3 further comprising:
- a third diode having its anode connected to said non-inverting input terminal and its cathode connected to ground;
- a second resistor connected in parallel with said third diode; and
- a third resistor connected between said inverting input terminal and ground.

7. The phantastron circuit according to claim 3 further comprising:
- a second resistor connected between said non-inverting input terminal and ground; and
- a third resistor connected between said inverting input terminal and ground.

8. The circuit according to claim 7 further comprising control means for modulating the duration of sweep pulses provided by said phantastron circuit, said control means comprising:
- a further diode having its cathode connected to said output terminal; and
- means for applying a modulation signal to the anode of said further diode, the level of said modulation signal corresponding to the lowest output level desired for the phantastron circuit during its sweep.

9. The circuit according to claim 3 further comprising control means for modulating the duration of sweep pulses provided by said phantastron circuit, said control means comprising:

a further diode having its cathode connected to said output terminal; and means for applying a modulation signal to the anode of said further diode, the level of said modulation signal corresponding to the lowest output level desired for the phantastron circuit during its sweep.

* * * * *